(12) United States Patent
Johnson

(10) Patent No.: US 7,975,193 B2
(45) Date of Patent: Jul. 5, 2011

(54) SOLID STATE STORAGE END OF LIFE PREDICTION WITH CORRECTION HISTORY

(75) Inventor: Joshua Johnson, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 192 days.

(21) Appl. No.: 12/475,716

(22) Filed: Jun. 1, 2009

(65) Prior Publication Data

US 2010/0306581 A1 Dec. 2, 2010

(51) Int. Cl.
*G11C 29/00* (2006.01)

(52) U.S. Cl. ............ 714/723; 714/2; 714/5; 714/7; 714/25; 714/30; 714/31; 714/42; 714/704; 714/718; 714/721; 714/745; 711/102; 711/103; 365/185.01; 365/185.33

(58) Field of Classification Search ............... None
See application file for complete search history.

(56) References Cited

U.S. PATENT DOCUMENTS

| | | | |
|---|---|---|---|
| 7,472,331 B2 * | 12/2008 | Kim ........................ | 714/763 |
| 7,512,847 B2 * | 3/2009 | Bychkov et al. ............ | 714/723 |
| 7,653,778 B2 * | 1/2010 | Merry et al. ................ | 711/103 |
| 2007/0109856 A1 * | 5/2007 | Pellicone et al. ........ | 365/185.09 |
| 2007/0266200 A1 * | 11/2007 | Gorobets et al. .......... | 711/103 |
| 2008/0082726 A1 * | 4/2008 | Elhamias ................... | 711/103 |
| 2008/0162079 A1 * | 7/2008 | Astigarraga et al. ........ | 702/182 |
| 2009/0282301 A1 * | 11/2009 | Flynn et al. ................. | 714/710 |
| 2009/0300277 A1 * | 12/2009 | Jeddeloh ..................... | 711/104 |
| 2009/0313444 A1 * | 12/2009 | Nakamura ................... | 711/159 |
| 2010/0011260 A1 * | 1/2010 | Nagadomi et al. .......... | 714/704 |
| 2010/0122148 A1 * | 5/2010 | Flynn et al. ................. | 714/773 |

* cited by examiner

Primary Examiner — John P Trimmings

(57) ABSTRACT

Described embodiments provide for end-of-life (EOL) checking for NAND flash devices. An exemplary implementation of a computing environment comprises at least one NAND data storage device operative to store one or more data elements. In the illustrative implementation, the EOL data processing and storage management paradigm allows for the storage of data according using a selected EOL enforcement algorithm that can utilize current and/or historical correction levels. The NAND data storage EOL checking module can be operable to cooperate with one or more NAND data store components to execute one or more selected EOL operations to protect stored data.

20 Claims, 5 Drawing Sheets

200

400

SOLID STATE STORAGE END OF LIFE PREDICTION WITH CORRECTION HISTORY

BACKGROUND

Recent technological trends in flash media have made it an attractive alternative for data storage in a wide spectrum of computing devices such as PDA's, mobile phones, embedded sensors, MP3 players, etc. The success of flash media for these devices is due mainly to its superior characteristics such as smaller size, lighter weight, better shock resistance, lower power consumption, less noise, and faster read performance than disk drives. While flash-memory has been the primary storage media for embedded devices, there is an increasing trend that flash memory will infiltrate the personal computer market segment. As its capacity increases and price drops, flash media can overcome adoption as compared with lower-end, lower-capacity magnetic disk drives.

NAND devices are generally manufactured and produced to be as simple and inexpensive as possible. Because of the low-cost demands for NAND flash, there is typically no resource applied to validating whether or not a command presented to the NAND flash is correct or in the best interest of the data contained in the flash part itself before it is processed; stated bluntly they are "dumb" devices. This poses a very real problem for storage devices that must meet certain expectations with respect to data protection.

The fabrication processes for NAND devices has traditionally not allowed for types of constructs that would make it easy to add embedded processing/checking power to the NAND device, thus there are only the simplest of state machines incorporated for processing NAND commands on the NAND device. Thus, it is up to the NAND controller to ensure the data integrity of the user data stored on the part. NAND controllers, however, are not "fool proof" given that errors in the NAND memory, firmware, or other components, can cause an otherwise correct controller command sequence to become an erroneous sequence. This erroneous sequence can cause the loss of user data.

Generally, the usefulness of a NAND device can be based on how long data can be written and then correctly read data from the NAND device. For NAND flash, each program/erase cycle increases the likelihood that there will be bit errors when the data is read back from the device. Since there is a likelihood that the data will need to be corrected when read back, there is typically a minimum amount of error correcting code (ECC) that is specified in the NAND datasheet to satisfy the correction requirements likely to be needed for the stated program/erase cycle range.

The prediction of End of Life (EOL) for solid state storage can be a critical operation to ensure continuing reliable operation of a NAND device. With current practices, a NAND device's EOL can be determined by tracking and comparing the number of erase cycles a NAND block has to an arbitrary pre-established maximum and providing a notification when the tabulated count is within a certain distance of the pre-calculated maximum.

It is appreciated from the foregoing that there exists a need for systems and methods to overcome the shortcomings of existing NAND architectures.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The subject matter described herein allows for systems and methods to for data processing and storage management. In an illustrative implementation an exemplary computing environment comprises at least one solid state data store (e.g., NAND data store) operative to store one or more data elements, a NAND data storage and management controller, a NAND data store end-of-life (EOL) checking module, and at least one instruction set to instruct the NAND data processing and storage controller and/or the NAND data store EOL checking module to process and/or store data according to a selected data processing and storage management paradigm. In the illustrative implementation, the data processing and storage management paradigm allows for the storage of data according using a selected EOL historical error correction algorithm.

In the illustrative implementation, the exemplary NAND data storage EOL checking module can be operable to calculate the EOL for an exemplary NAND data storage device according to a selected historical error correction calculation paradigm. In the illustrative implementation, the NAND data storage EOL checking module can comprise one or more logic gates and firmware algorithms that can be independent operable from the NAND data storage and management controller. In an illustrative operation, the exemplary NAND data storage EOL checking module can process one or more EOL data variables that can be aggregated by one or more NAND data storage device components cooperating with the NAND data storage EOL checking module. In the illustrative operation, the NAND data storage device can, based on the results of the EOL checking engine, perform one or more operations comprising, communicating an EOL error to one or more electronic environment cooperating components to the NAND data storage device, add additional parity to raise the correction threshold of the NAND data storage device, and reorganize stored data to move data from a region with a higher degree of risk for post error code correction errors to a region having a lower degree of risk as calculated by the exemplary data storage EOL checking module.

The following description and the annexed drawings set forth in detail certain illustrative aspects of the subject matter. These aspects are indicative, however, of but a few of the various ways in which the subject matter can be employed and the claimed subject matter is intended to include all such aspects and their equivalents.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
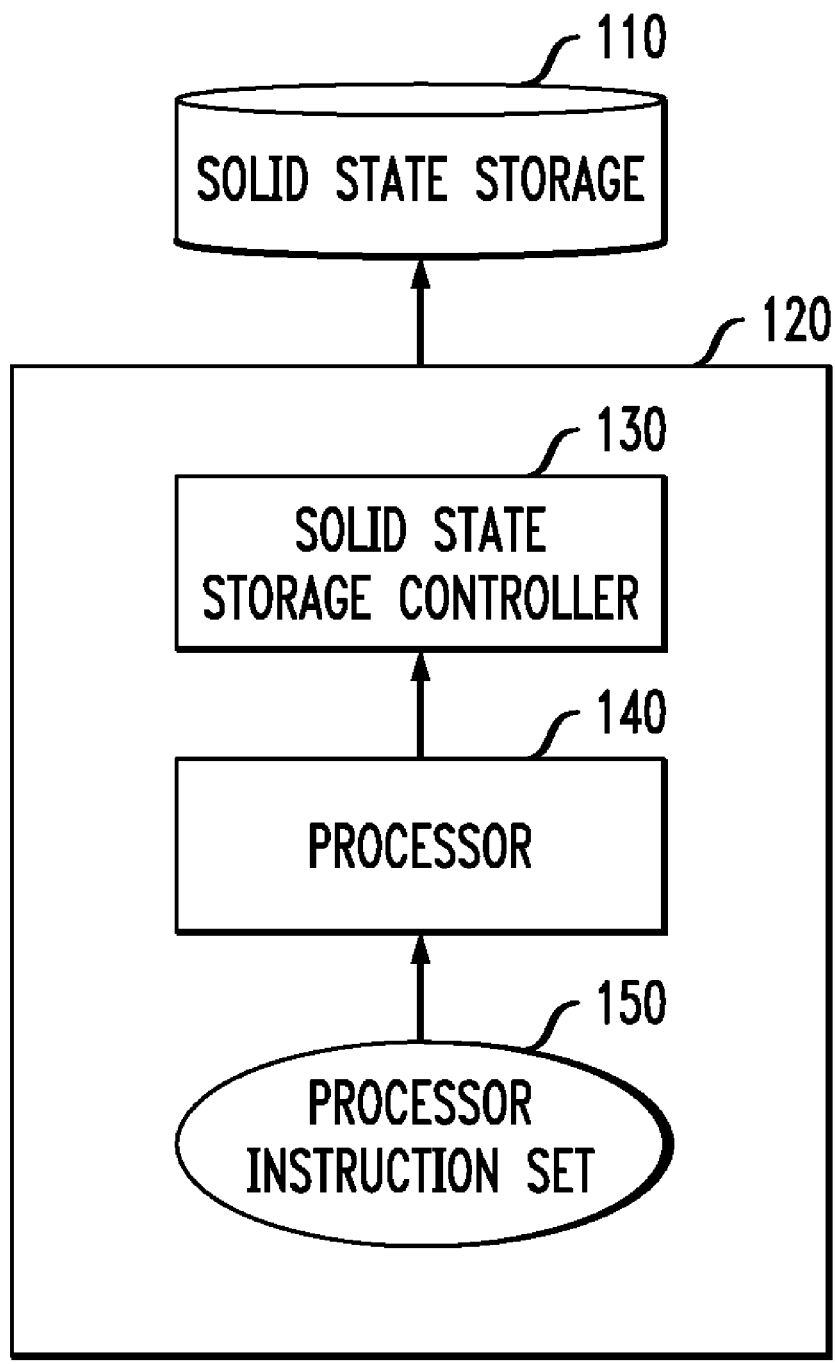
FIG. 1 is a block diagram of one example of an exemplary computing environment operating a NAND data store.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Flash Storage Media Overview:

Flash storage is generally available in three major forms: flash chips, flash cards, and solid state disk (SSD) drives. Flash chips are primarily of two types: NOR and NAND. While NOR flash has faster and simpler access procedures, its storage capacity is lower and hence it is used primarily for program storage. NAND flash offers significantly higher storage capacity (e.g., currently 4 GB in a single chip) and is more suitable for storing large amounts of data. The key properties of NAND flash that directly influence storage design are related to the method in which the media can be read or written.

With flash media, all read and write operations happen at page granularity (or for some chips down to ⅛ th of a page granularity), where a page is typically 512-4096 bytes. Pages are organized into blocks, typically of 32 or 128 pages. A page can be written only after erasing the entire block to which the page belongs. However, once a block is erased, all the pages in the block can be written once with no further erasing. Page write cost (ignoring block erase) is typically higher than read, and the block erase requirement makes some writes even more expensive. A block wears out after 10,000 to 100,000 repeated writes, and so the write load should be spread out evenly across the chip. Because there is no mechanical latency involved, random read/write is as fast as sequential read/write (assuming the writes are for erased pages).

Flash cards such as compact flash (CF) cards, secure digital (SD) cards, mini SD cards, micro SD cards and USB sticks provide a disk-like interface on top of flash chips. The interface is provided through a Flash Translation Layer (FTL), which emulates disk-like in-place update for a (logical) address L by writing the new data to a different physical location P, maintaining a mapping between each logical address (L) and its current physical address (P), and marking the old data as "dirty" for later garbage collection.

Thus, although FTL enables disk-based applications to use flash without any modification, it needs to internally deal with flash characteristics (e.g., erasing an entire block before writing to a page).

SSD drives are high capacity (e.g., 512 GB SSDs are currently available) flash packages that use multiple flash chips in parallel to improve read/write throughput. Like flash cards, they use an FTL, and hence suffer from the same performance problems for random writes. Further, write operations may consume more energy than erase because the duration that power is applied while writing a bit is extended in order to ensure the bit is written.

Data Storage And Management Features Deployed On Flash Media:

FIG. 1 shows an exemplary computing environment 100 operable to control and manage data storage on one or more solid state storage devices (e.g., flash media). As is shown, in an illustrative implementation, exemplary computing environment 100 comprises computer environment 120 and solid state storage device 110. Further, as is shown, computer environment comprises solid storage device controller 130, processor 140, and processor instruction set 150.

In an illustrative operation, computing environment 100 can process data for storage and management on solid state storage device 110. In the illustrative operation, processor 140 of computer environment 120 can process data for storage and management on solid state storage device 110 by executing one or more instructions from processor instruction set 150 allowing for the storage and/or management data on solid state storage device 110 through solid state storage controller 130. Operatively, solid state storage controller 130 directed by processor 140 can store and/or manage data on solid state storage device 110 according to one or more data storage principles applicable to the storage and/or management of data on solid state storage devices.

In an illustrative implementation, exemplary data storage principles include, but are not limited to, (i) deleting items in batch and (ii) cluster items to delete together in as few blocks as possible. Stated differently, deleting data in a solid state storage device (e.g., flash media) generally requires a block erase operation. That is, before erasing a block, valid data in the block is copied to some other location, which requires reading and writing all the valid data. The amortized cost of deleting an item can be made orders of magnitude smaller by deleting multiple items with a single erase operation, such as by clustering together data that will be deleted in the same block.

A second exemplary principle considers updating data already written to flash media. Stated differently, flash media does not allow updating data in place. Another exemplary principle considers allocating and de-allocating storage space in granularity of blocks. Possible choices for an allocation/de-allocation size can include: (i) sub-page granularity, where fractions of a single flash page are allocated independently (i.e., the same flash page can contain multiple independent data units), (ii) page granularity, where each entire page is allocated independently, and (iii) block granularity, where each entire flash block is allocated independently.

Another solid state storage operating principle considers avoiding random writes in flash media. Generally, flash media is an electronic device and thus has no mechanically moving parts like disk heads in a magnetic disk drive. Therefore, a raw flash memory chip can provide similar sequential and random access speed. However, flash media generally provide poor random write performance.

It is appreciated that although solid state storage device 110 is shown to be independent of computer environment 150 that such description is merely illustrative as the inventive concepts described herein also are applicable to a computing environment 100 which includes a solid state storage device/component within a computer environment as well.

Figure 2:
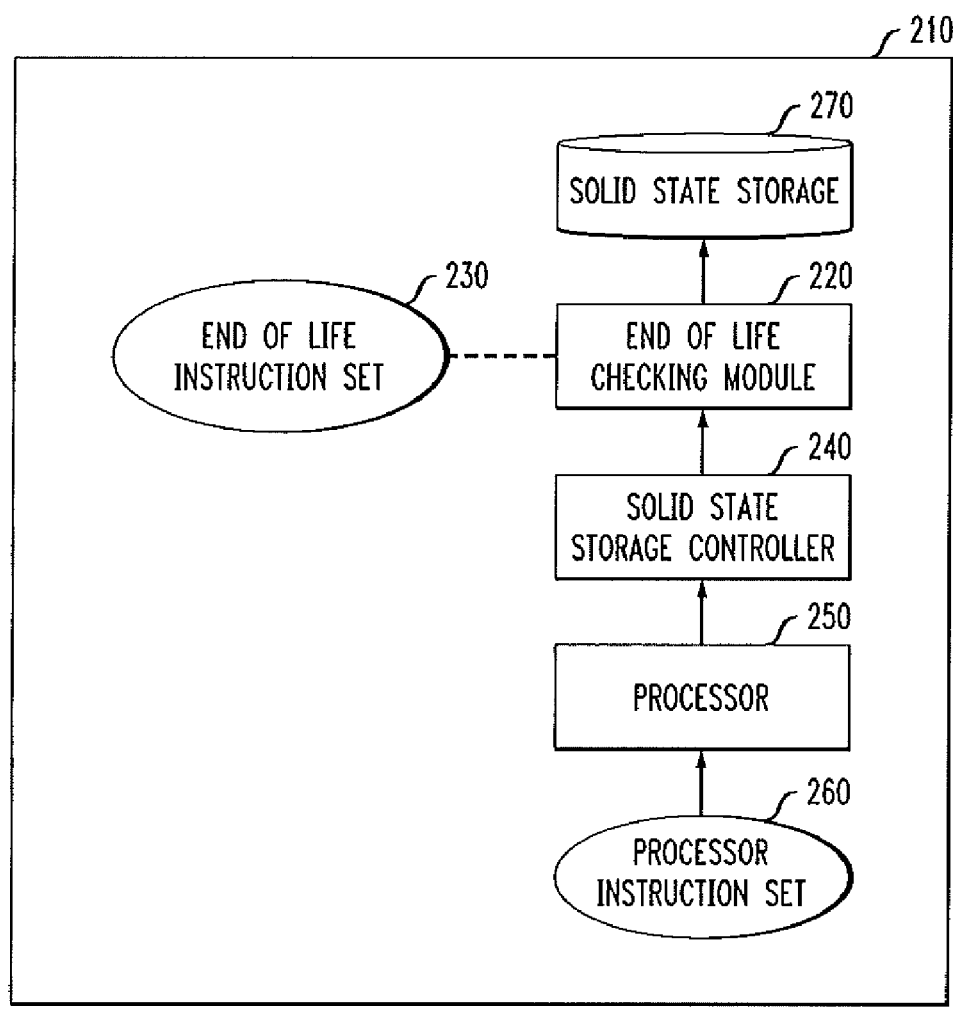
FIG. 2 is a block diagram of an exemplary computing environment deploying a NAND data store performing one or more end-of-life (EOL) checking operations in accordance with the herein described systems and methods.

FIG. 2 shows exemplary computing environment 200 operable to control and manage data storage on one or more solid state storage devices (e.g., flash media). As is shown in FIG. 2, in an illustrative implementation, exemplary computing environment comprises computer environment 210 and solid state storage device 270. Further, as is shown, computer environment 210 comprises processor 250, processor instruction set 260, solid state storage controller 240, end-of-life (EOL)

checking module 220, and end-of-life (EOL) checking instruction set 230. In the illustrative implementation, processor 250, solid state storage controller 240, EOL checking module 220 and solid state storage device 270 are electronically coupled allowing for the communication of various data and/or instructions for storage and/or execution.

In an illustrative operation, computing environment 200 can process data for storage and management on solid state storage device 270. In the illustrative operation, processor 250 of computer environment 210 can process data for storage and management on solid state storage device 270 by executing one or more instructions from processor instruction set 260 allowing for the storage and/or management data on solid state storage device 270 through (i) solid state storage controller 240, and (ii) EOL checking module 220 operating according to a selected EOL checking paradigm described by one or more EOL checking instructions provided by EOL checking instruction set 230. Operatively, solid state storage controller 240 directed by processor 250 can store and/or manage data on solid state storage device 270 according to one or more EOL driven data storage principles applicable to the storage and/or management of data on solid state storage devices as illustratively provided by EOL checking module 220 operating according to one or more instructions provided by EOL checking instruction set 230.

In an illustrative implementation, current and historical bit error corrections can be utilized by EOL checking module 220 to calculate the length of time an exemplary NAND device can perform program/erase cycles, and to calculate the amount of time the data stored on the NAND device can be reliably stored on the NAND device.

Figure 3:
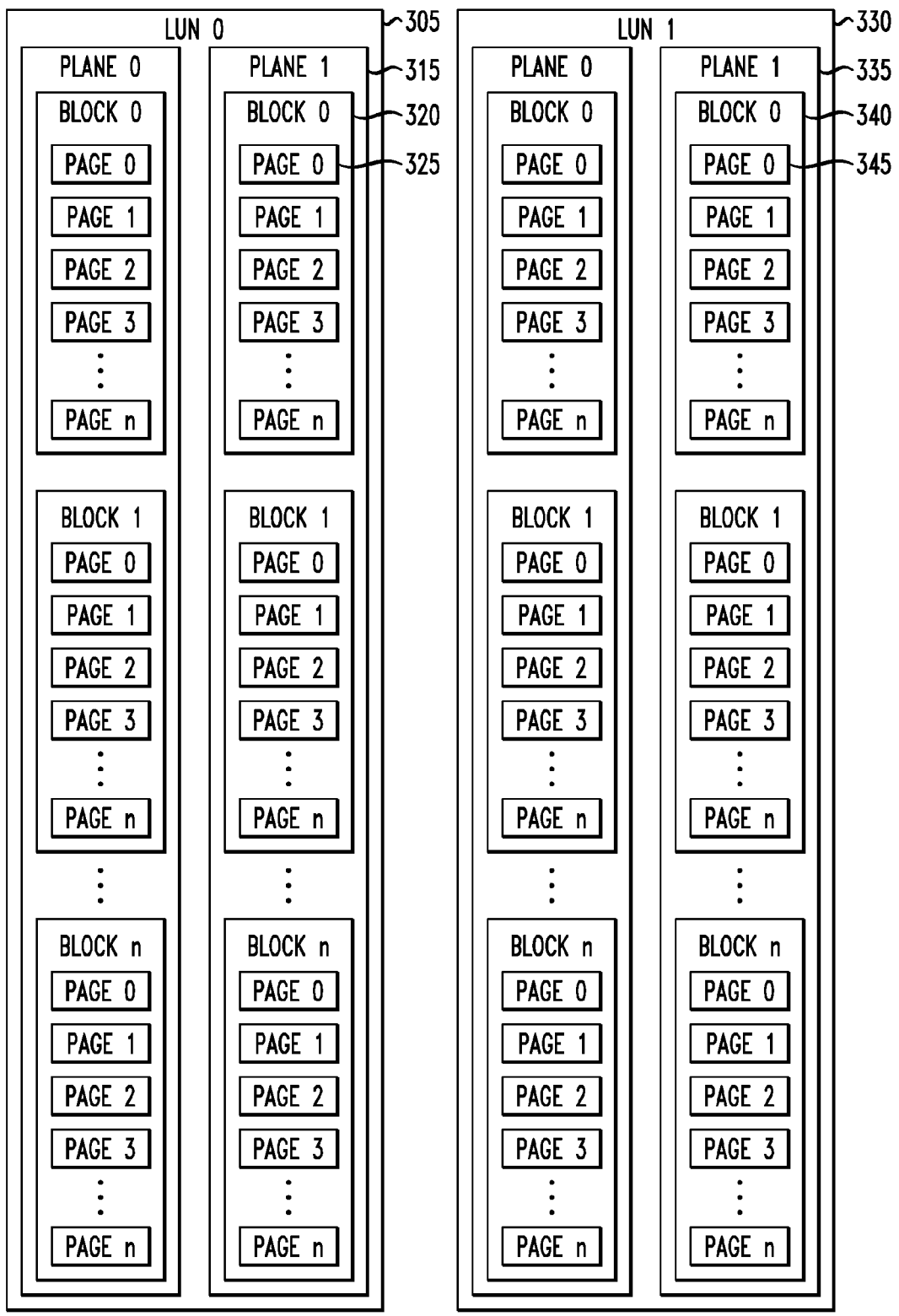
FIG. 3 is a block diagram of an exemplary NAND data store architecture in accordance with the herein described systems and methods.

FIG. 3 illustratively describes a typical NAND organization as might be employed with embodiments of the present invention. As is shown in FIG. 3, an exemplary NAND storage device 300 comprises one or more logical unit numbers (LUN) 305 and 330 operating on one or more planes 315 and 335. Further, each LUN can comprise one or more blocks 320 and 340 where a block can comprise one or more page 325 and 345. Operationally and, by convention, a NAND page can be considered to be the smallest unit to which data can be written. Further, by convention, NAND pages can be partially programmed, but with contemplated practices a NAND page can be constrained to receive one write, rendering such page static until it is erased. Accordingly, NAND blocks can be considered to be the smallest unit that can be erased at once. By way of example, pages contained in the block can all be are erased at once such that data is not able to be retrieved after the erase has occurred. A further restriction that might apply to exemplary NAND device 300 is that the pages are required to be programmed in a given order, such as an order that page 0 is first programmed, followed by page 1, followed by page 2, and so on.

In addition to rules relating to how a NAND device may be programmed and erased, by convention, a number of restriction and constraints exist regarding how commands can be issued when there are multiple LUN's as well as when there are multiple planes involved.

In an illustrative implementation, the EOL policy enforcement can take the form of logic gates, firmware algorithms, or both (e.g., EOL checking module 220 of FIG. 2). In the illustrative implementation, the policy enforcement module can be independent from the controller's primary computing in such a way that an error in the primary portion of the logic does not cause an error when performing data storage and/or management operations on the NAND storage device 300.

Figure 4:
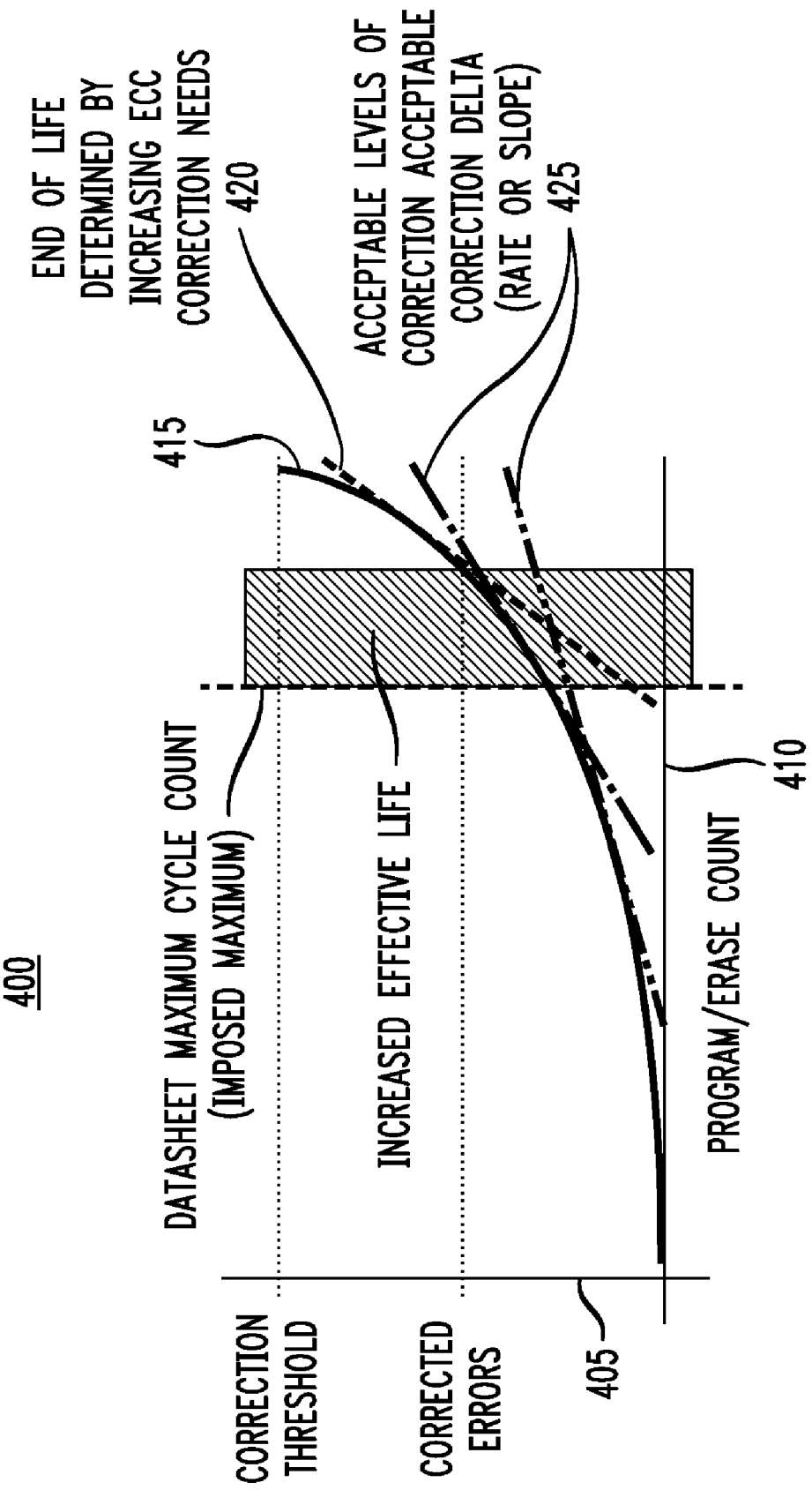
FIG. 4 is a graphical diagram describing exemplary processing thresholds when performing end-of-life (EOL) processing for an exemplary NAND data storage device in accordance with the herein described systems and methods.

FIG. 4 shows graph 400 showing the relationship 415 of corrected errors 405 over cycle count 410 (e.g., the counted number of program/erase cycles for an exemplary NAND flash device). As is shown in FIG. 4, an EOL scheme that used the counting approach only, would decommission a drive at a predetermined erase count number (imposed maximum) even though there is a still a significant amount of useful life left in the storage (the gray rectangle shown in the graph). As is shown, the counting approach does not take into account the extension of useful life through increased or increasing levels of correction (raising the correction threshold) (line 420). Further, the rate of change of successive correction levels, or instantaneous rate of change of correction levels, shown as the slope of the various graph lines 425, can be utilized as an indicator of the reliability of physical cells of a NAND device.

In the illustrative implementation, the historical and current levels of error correction in the calculation of drive EOL can be utilized. It is appreciated that although the illustrative implementation is described to use historical and current levels of bit correction in the EOL calculation that the use of such variables is merely illustrative as other variables can be utilized. In the illustrative implementation, trend data for the bits corrected at the page or block level of the NAND flash can be stored and utilized to interpolate a curve as described in FIG. 4 for use in predicting the future correction requirements of the data stored on the NAND device and when that correction will likely exceed a selected threshold thus rendering the data unreadable (e.g., such threshold calculation can be described as the EOL of the NAND device). In an illustrative operation, the NAND device may choose any number of paths to take when the EOL is calculated including but not limited to providing notification that the stored data (and/or data to be stored) will not be fully correctable, or the NAND device may choose to add additional parity to effectively raise the correction threshold at the expense of user capacity or spare reserve, and/or the NAND device may reorganize data to place less critical data in the region with the highest degree of risk for uncorrectable errors.

In the illustrative operation, an exemplary data storage EOL checking module can be utilized by one or more cooperating electronic environment components to identify data storage components that are undertaking similar workloads. Such illustrative operation is particularly desirable in applications, such as those in redundant array of inexpensive disks (RAID) applications, where the failure (or expiry) of multiple disks at the same time is very undesirable. In some cases, the drive might be "expired" before a threshold of the counted method because some type of manufacturing defect or environmental abuse caused additional stress to the part and the number of bit errors is exceedingly high.

Figure 5:
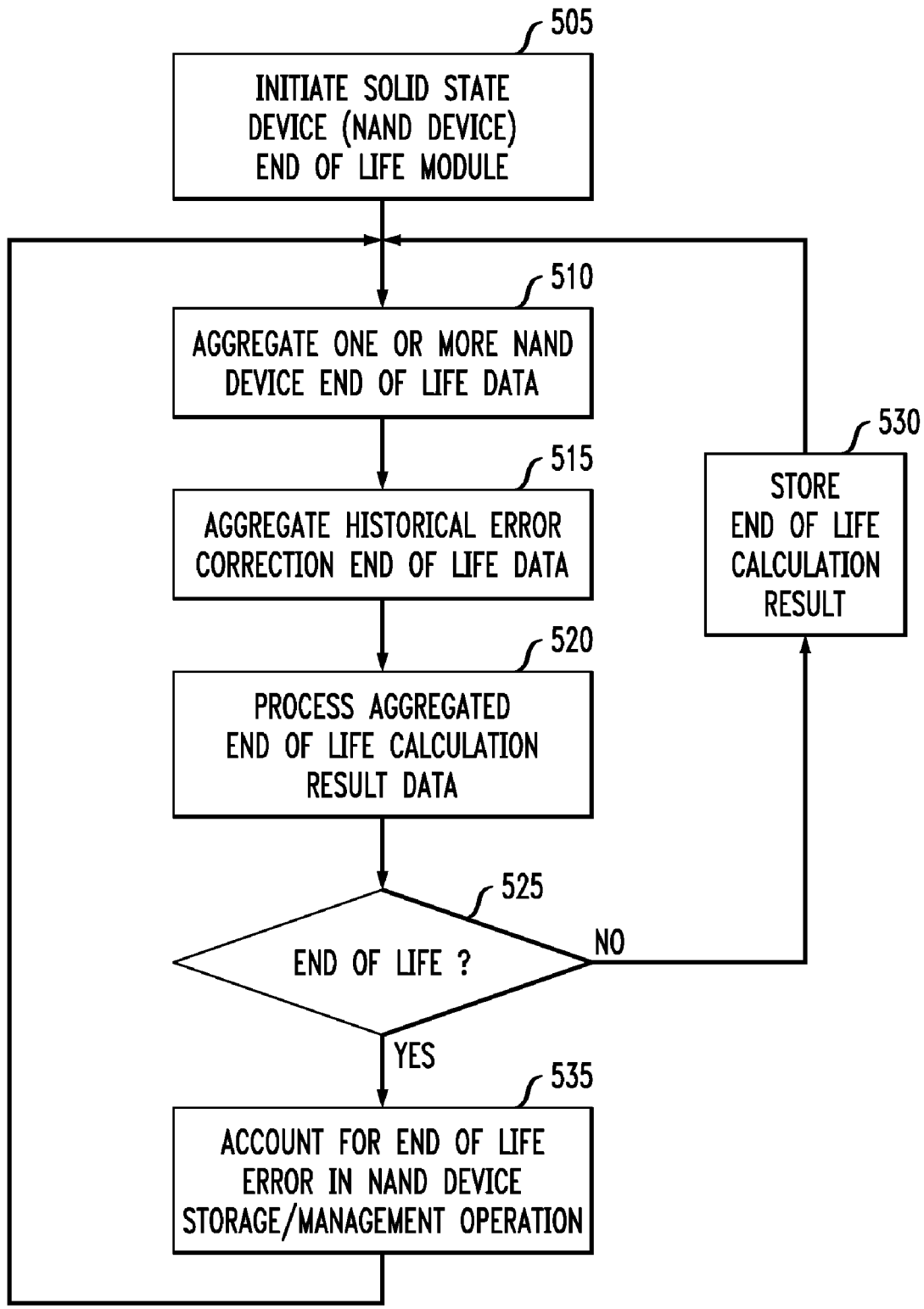
FIG. 5 is a flow diagram of exemplary processing performed when checking EOL status of a NAND data store in accordance with the herein described systems and methods.

FIG. 5 shows exemplary processing 500 performed when undertaking end-of-life (EOL) checking on a NAND data storage device. As is shown, processing begins at block 505 where the NAND EOL checking module is initiated. Processing then proceeds to block 510 where one or more NAND device EOL data is aggregated. From there, processing proceeds to block 515 where current and/or historical error correction EOL data is aggregated. The aggregated one or more NAND device EOL data and current/historical error correction EOL data is then processed at block 520 to calculate an estimated EOL calculation using the current and/or historical error correction data for the reliability of the NAND device. A check is then performed at block 525 to determine if the NAND device's calculated EOL has surpassed a selected threshold. If the check at block 525 indicates that the selected EOL threshold has been reached, processing proceeds to block 535 where the EOL error is accounted for by one or more NAND data storage/management operations. From block 535, processing returns to block 510 and proceeds there from.

However, if the check at block 525 indicates that the EOL calculation has not met a selected threshold, processing proceeds to block 530 where the end-of-life calculation is stored for subsequent processing (e.g., processing at block 515). Processing then reverts to bock 510 and proceeds from there.

A number of advantages result when utilizing the herein described systems and methods including but not limited to providing the ability to an electronic environment to more reliably identify the expiration of a NAND flash device (i.e., that is not available when utilizing current EOL prediction practices—counting methods) so that for NAND flash devices having similar/identical workloads, the electronic environment can de-provision such devices simultaneously thereby protecting the data stored on such devices. The herein described systems and methods can be applied to RAID types of applications where the failure (or expiry) of multiple NAND flash devices at the same time is very undesirable. Furthermore, the herein described system and methods can be utilized in identifying NAND flash devices having one or more manufacturing defects and/or environmental abuse that current practices (e.g., counting methods) could overlook.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

Reference herein to "as illustrative implementation", "one embodiment", or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

What is claimed is:

1. An apparatus performing end-of-life (EOL) checking in an NAND storage device comprising:
   one or more NAND data storage elements;
   a NAND EOL checking module operable to process one or more commands for the management of data on the one or more NAND data storage elements; and
   an instruction set comprising one or more instructions to instruct the NAND EOL checking module to perform one or more calculations to determine a selected threshold EOL for the NAND storage device according to a selected NAND EOL checking paradigm,
   wherein the NAND EOL checking paradigm comprises at least one instruction to process EOL data representative of current and historical data, and at least one instruction to add parity to raise the selected threshold EOL if the one or more commands result in an EOL event.

2. The apparatus as recited in claim 1, wherein the NAND EOL checking module comprises one or more logic components cooperating with a micro-processor based electronic environment to process one or more commands for the management of data.

3. The apparatus as recited in claim 2, wherein the NAND EOL checking module executes a selected EOL checking algorithm executable on the NAND storage device.

4. The apparatus as recited in claim 1, wherein the NAND EOL checking module is co-located with the one or more NAND storage elements.

5. The apparatus as recited in claim 1, wherein the NAND EOL checking module is co-located with a NAND controller.

6. The apparatus as recited in claim 1, wherein the NAND EOL checking module is operatively located between the one or more NAND storage elements and a NAND controller.

7. The apparatus as recited in claim 1, wherein one or more commands are received by a NAND controller from a cooperating micro-processor based electronic environment for the management of data.

8. The apparatus as recited in claim 7, wherein the NAND one or more EOL calculations are performed using one or more EOL data operationally stored on the NAND device.

9. A method to perform end-of-life (EOL) checking for a NAND storage device comprising:
   receiving one or more commands to manage data on the NAND storage device by a NAND EOL checking module;
   identifying one or more EOL data for the NAND storage device;
   processing the one or more received commands in context of the identified one or more EOL data;
   performing an EOL calculation to determine the EOL threshold for the NAND storage device and to determine if the one or more received commands result in an EOL event;
   absent an EOL event, performing a data management operation on the NAND storage device to retrieve data in accordance with the one or more received commands;
   if the one or more received commands result in au EOL event, adding parity to raise the correction threshold of the NAND storage device.

10. The method as recited in claim 9, further comprising communicating an error to the source of the one or more received commands.

11. The method as recited in claim 9, further comprising initiating the NAND EOL checking module to process one or more selected EOL calculations.

12. The method as recited in claim 11, further comprising selecting the one or more EOL calculations according to one or more selected current and historical error correction characteristics of the NAND storage device.

13. The method as recited in claim 9, further comprising receiving one or more commands for the management of data by a NAND controller from one or more components of a micro-processor based electronic environment.

14. The method as recited in claim 13, further comprising processing the one or more received commands by the NAND EOL checking module.

15. The method as recited in claim 14, further comprising performing a EOL check on the one or more received commands.

16. The method as recited in claim 15, further comprising communicating an error to the source of the one or more received commands upon the occurrence of a EOL event.

17. The method as recited in claim 16, further comprising performing a data storage/management operation on one or more NAND data storage elements of the NAND storage device.

18. The method as recited in claim 9, further comprising performing a data storage/management operation on one or more NAND data storage elements of the NAND storage device.

19. The method as recited in claim 13, further comprising performing one or more NAND data storage/management operations upon a determination that an EOL event has occurred comprising,
   providing a notification that data being requested to be stored is not correctable, and reorganizing data to place data in a region having lower risk of data error.

20. A machine-readable storage medium, having encoded thereon program code, wherein, when the program code is executed by a machine, the machine implements a method for performing EOL checks on a NAND storage device, comprising:
   receiving one or more commands to manage data on the NAND storage device by a NAND EOL checking module;
   identifying one or more EOL data for the NAND storage device;
   processing the one or more received commands in context of the identified one or more EOL data;
   performing an EOL calculation to determine the EOL threshold for the NAND storage device and to determine if the one or more received commands result in an EOL event; and absent an EOL event, performing a data management operation on the NAND storage device to retrieve data in accordance with the one or more received commands; if the one or more received commands result in an EOL event, adding parity to raise the correction threshold of the NAND storage device.

* * * * *